United States Patent [19]

Sattin

[11] Patent Number: 4,866,386
[45] Date of Patent: Sep. 12, 1989

[54] HIGH SIGNAL-TO-NOISE, RAPID CALIBRATION OF RF PULSES

[75] Inventor: William Sattin, Cleveland Hts., Ohio

[73] Assignee: Picker International, Inc., Highland Hts., Ohio

[21] Appl. No.: 186,447

[22] Filed: Apr. 26, 1988

[51] Int. Cl.[4] .............................................. G01R 33/20
[52] U.S. Cl. ..................................... 324/314; 324/312
[58] Field of Search ............... 324/307, 308, 309, 310, 324/312, 314, 317

[56] References Cited

U.S. PATENT DOCUMENTS

| | | | |
|---|---|---|---|
| 4,710,715 | 12/1987 | Mee et al. | 324/307 |
| 4,739,267 | 4/1988 | Leroux et al. | 324/314 |
| 4,739,268 | 4/1988 | Fox | 324/314 |

OTHER PUBLICATIONS

"A Novel Method for Rapid Pulse Angle Optimisation", by P. vander Muelen and G. H. van Yperen, Abstract from SMRM 1986, pp. 1129-1130.

"Exploiting the Stimulated Echo in Nuclear Magnetic Resonance Imaging II Applications", by Sattin, et al., Journal of Magnetic Resonance 65, pp. 298-307, (1985).

Primary Examiner—Michael J. Tokar
Assistant Examiner—Louis M. Arana
Attorney, Agent, or Firm—Fay, Sharpe, Beall, Fagan, Minnich & McKee

[57] ABSTRACT

In a magnetic resonance imaging or spectroscopy apparatus, radio frequency pulses of a selected size are applied to cause a corresponding tip angle. However, the actual tip angle which results varies with, for example, coil loading and patient geometry. For accuracy of the resultant image or data, the RF pulse size is adjusted or calibrated to produce a selected tip angle precisely - most commonly 90° and 180° tip angles. To calibrate the 90° tip angle, a sequence of three like pulses ($\alpha$-$\alpha$-$\alpha$) is applied. In each repetition, the pulses are varied in magnitude to produce tip angles around 90° and the actual resulting tip angles are determined. The RF pulse size that produces or is projected by a least-squares fit to produce the exact 90° tip angle is determined. To calibrate the 180° tip angle, the pulse sequence includes the RF pulse ($\alpha$) determined to produce the 90° tip followed by two additional RF pulses ($\beta$). The sequence ($\alpha$-$\beta$-$\beta$) is repeated a plurality of times with the second and third RF pulses varied to produce tip angles around 180°. From the zero frequency terms of Fourier transforms of the induced primary and stimulated echoes, the actual tip angle is determined. The RF pulse for producing a 180° tip angle is calibrated to the size which produces or is projected to produce the 180° tip angle.

13 Claims, 3 Drawing Sheets

HIGH SIGNAL-TO-NOISE, RAPID CALIBRATION OF RF PULSES

BACKGROUND OF THE INVENTION

The present invention relates to the art of calibrating RF pulses. It finds particular application in conjunction with magnetic resonance imaging and will be described with particular reference thereto. However, it is to be appreciated that the invention has other applications such as magnetic resonance spectroscopy.

In magnetic resonance imaging, radio frequency pulses are applied to tip the magnetization vector of resonating nuclei by selected tip angles. If the radio frequency pulses produce a tip angle which differs from a selected tip angle, the difference or error will cause errors in the results of the magnetic resonance procedure.

In magnetic resonance imaging, each patient changes the loading on the coil. The change in load, as well as differences in patient geometry, changes the power level of the RF pulse required to produce a selected tip angle. In each patient, a given RF pulse power produces a different tip angle in accordance with the loading differences from patient to patient. To eliminate this source of error, the RF pulses are conventionally recalibrated for each patient.

Various calibration techniques may be implemented. In one technique, a magnetic resonance sequence is implemented to elicit a magnetic resonance signal which is sensitive to the RF tip angle. The variations in the magnetic resonance signal are correlated and analyzed to give an indication of the RF energy required to yield the selected tip angle in vivo.

The RF calibration may depend on the formation of a conventional spin echo signal. An overall RF scale factor is adjusted in order to maximize the spin echo magnitude. More specifically, a sequence is chosen which produces a spin echo signal. A maximum RF value is determined from the sequence, taking into account SAR constraints. The RF scale value is incremented from zero to its maximum in a selected plurality of equal increments. At each incremental value, five repetitions of the RF sequence are produced. The spin echo signal from the last two repetitions are averaged and the peak magnitude is recorded. This procedure is repeated until a maximum peak magnitude is identified. A new RF scale region is defined with the lower limit being the incremental point just prior to the maximum and the upper limit being the incremental point to the other side of the maximum. The RF scale value is incremented through the new region from its lower limit to its upper limit in the preselected plurality of smaller increments. Peak magnitude data is recorded as described above for each incremental point, independent of the position of the maximum. The position of the maximum peak magnitude is determined by data interpolation and another new RF scale range is determined. Incrementing the RF scale value and recording the peak magnitude for each incremental point is repeated for the new RF scale value range. The RF scale value which results in the maximum peak magnitude of the latest RF scale value range is determined by data interpolation. Appropriate 90° and 180° tip angles are determined from this RF scale value.

Although this technique sets the 90° and 180° tip angles, it is time consuming and not necessarily completely accurate. Typically, about two minutes are required for this sequence to be computer implemented.

In another technique, the RF calibration procedure is much faster, but at the cost of very low accuracy around the 180° tip angle. Three identical RF pulses of an as yet unknown tip angle $\alpha$ are applied in the presence of a constant gradient. The three pulses produce a number of echoes including spin echoes and a stimulated echo. Each echo had a specific dependence on the intensity of the tip angle $\alpha$, the timing parameters, and the relaxation parameters. For the combination of the stimulated echo and the first spin echo, the ratio of the intensity varies strongly with the angle $\alpha$, more specifically $2\cos^2(\alpha/2)$. Because the intensity of the two echoes is readily measurable, the angle $\alpha$ can be readily calculated. By adjusting the power, the RF pulse can be readily scaled to the desired tip angle. If the initial angle is different from the desired angle, the process is repeated quickly.

Although the calibration of 90° pulses are quick and accurate, calibration of 180° pulses are very inaccurate. The signal-to-noise ratio for this pulse sequence with three 180° pulses is very low. A theoretically perfect 180° used in this pulse sequence would result in a zero signal-to-noise ratio and thus, could not be used for calibration.

Another technique for calibrating the RF pulse requires electronic measurements to be made on the coil in the absence of a magnetic resonance signal.

The present invention contemplates a new and improved RF calibration scheme which overcomes the above referenced problems and others.

SUMMARY OF THE INVENTION

In accordance with one aspect of the present invention, a method of calibrating RF pulses is provided. First, second, and third RF pulses are applied in the presence of a constant gradient to induce a stimulated echo and at least one spin echo. The first pulse has a first selected tip angle and the second and third pulses have a second selected tip angle.

In accordance with a more limited aspect of the invention, the first pulse has the tip angle which provides an optimum signal-to-noise ratio. The pulse sequence is repeated with a plurality of different second and third pulse tip angles in order to calibrate a corresponding range of RF pulses.

One advantage of the present invention is that it calibrates a full range of RF pulses accurately.

Another advantage of the present invention is that it can calibrate both amplitude modulated and frequency or phase modulated shaped RF pulses.

Yet another advantage of the present invention is that it calibrates RF pulses rapidly.

Still further advantages of the present invention will become apparent to those of ordinary skill in the art upon reading and understanding the following detailed description.

BRIEF DESCRIPTION OF THE DRAWINGS

The invention may take form in various steps and arrangements of steps or in various components or arrangements of components. The figures are only for illustrating a preferred embodiment and are not to be construed as limiting it.

DETAILED DESCRIPTION OF THE PREFERRED EMBODIMENT

Figure 1:
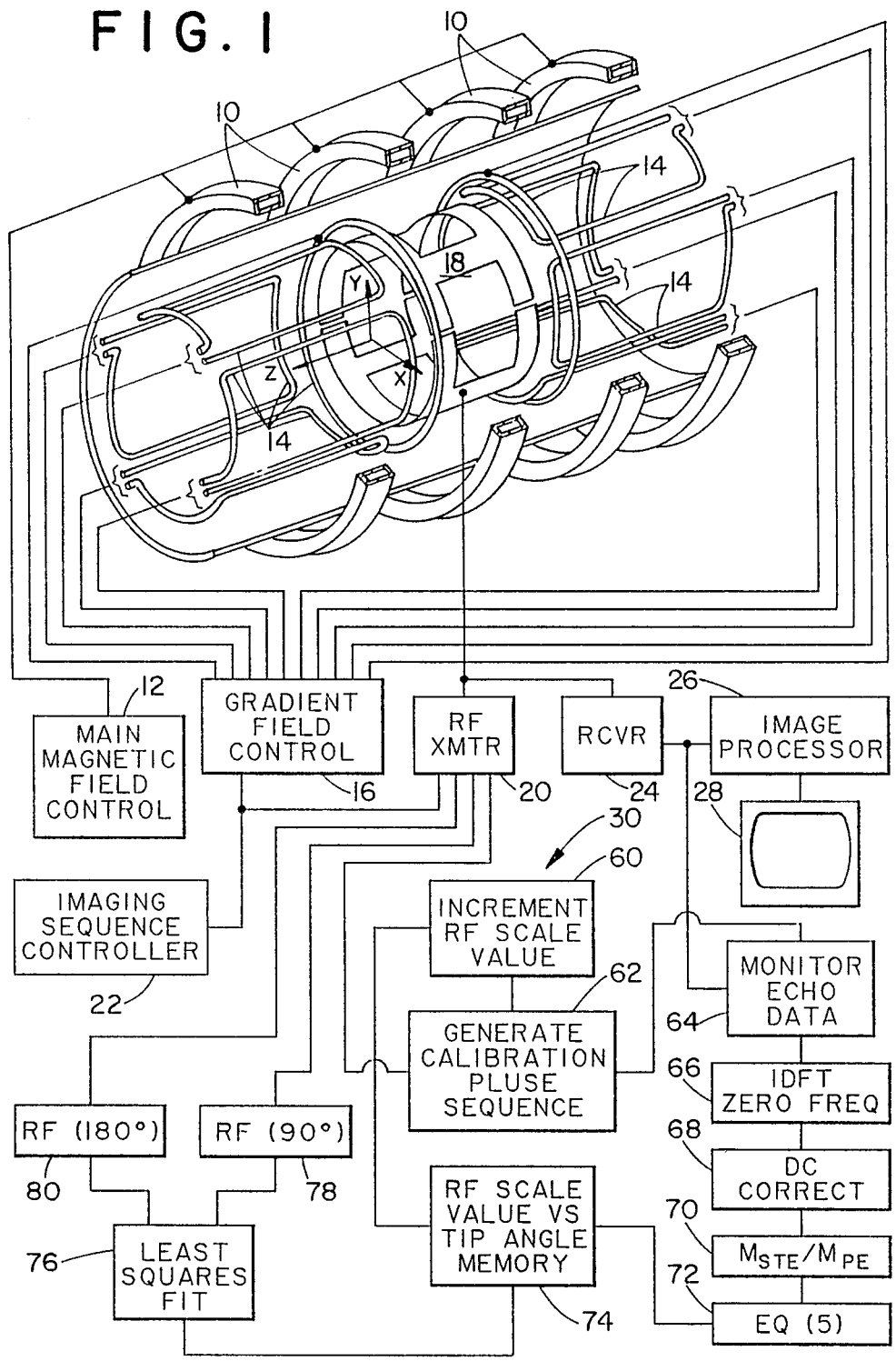
FIG. 1 is a diagrammatic illustration of a magnetic resonance imager with a calibration means in accordance with the present invention.

With reference to FIG. 1, magnets 10 under the control of a magnet control means 12 generate a generally uniform main magnetic field through an image region. Gradient field coils 14 convert electrical pulses from a gradient field control means 16 into magnetic field gradients across the main magnetic field. Conventionally, the gradients are along three orthogonal axes—the slice select, read, and phase encode axes. Radio frequency (RF) pulses are transmitted into the examination region by radio frequency coils 18. An RF pulse generator or transmitter 20 formats each RF pulse with selected magnitudes or RF scale values. Each RF scale value is selected to cause a corresponding selected tip angle of the magnetization of resonating dipoles in the image region, commonly 90° and 180° tip angles. A sequence controller 22 controls the gradient field control means 16 and the RF pulse generator 20 to produce selected imaging or other magnetic resonance sequences. Magnetic resonance signals from the examination region are monitored by a receiver 24 and reconstructed into an image by an image processing means 26. The image or processed data may be displayed on a display 28, stored, subject to further processing, or the like. The changes in coil loading and variable patient geometry from patient to patient change the resultant tip angle for a given RF scale value. A calibration means 30 correlates the selected tip angles to corresponding RF scale values.

Figure 2:
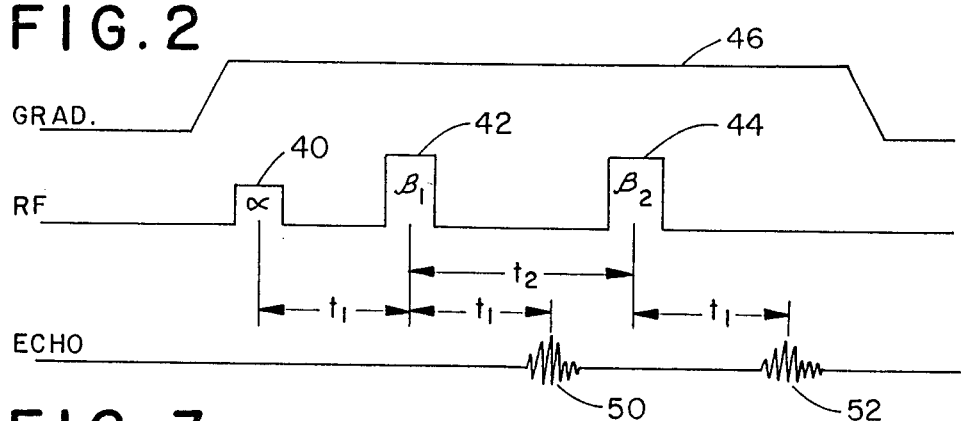
FIG. 2 is a diagrammatic illustration of a calibration RF pulse sequence in accordance with the present invention.
Figure 3:
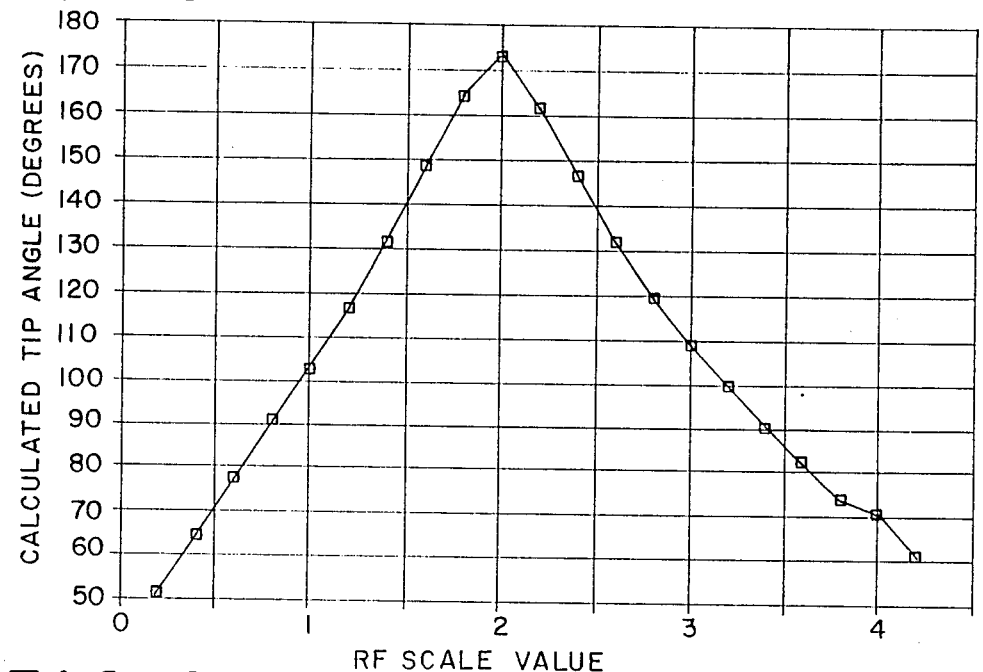
FIG. 3 illustrates fitting a curve to acquired tip angle vs. RF scale value calibration data; and, FIG. 4 illustrates an alternate calibration RF pulse sequence.

With reference to FIG. 2, a first RF pulse 40 with a tip angle $\alpha$, a second RF pulse 42 with a tip angle $\beta_1$, and a third RF pulse 44 with a tip angle $\beta_2$ are sequentially applied in the presence of a magnetic field gradient 46. The first RF pulse 40 at time zero creates transverse magnetization in a rotating frame. The transverse magnetization precesses freely during a first time interval $t_1$. The second RF pulse splits the existing transverse magnetization into three parts, one of which refocuses to generate a primary echo 50 with a maximum amplitude $M_{pe}$ a time $t_1$ after the second RF pulse 42. The amplitude $M_{pe}$ is given by:

$$M_{pe} = M_o \sin\alpha \sin^2(\beta_1/2) e^{-(2t1/T2)} SAT \qquad (1),$$

where $$SAT = 1 - e^{-TR/T1} \qquad (2),$$

where $M_0$ is the equilibrium magnetization, TR is the sequence repetition time, $\alpha$ is the first pulse tip angle, $\beta_1$ is the second pulse tip angle, T2 is the spin-spin relaxation time, and T1 is the spin-lattice relaxation time. SAT is the term which describes the reduction in signal intensity due to saturation, i.e. due to repeating the sequence in a time on the order of T1 or less. A multiplicative factor associated with diffusion damping has been arbitrarily set to one.

If $t_1$ is selected to be on the order of T2 or less, there is appreciable transverse magnetization at the time of the second RF pulse 42. Therefore, in addition to inducing a primary echo, the second RF pulse also produces net longitudinal magnetization which retains its phase memory. The third RF pulse 44 which comes a time interval $t_2$ after the second RF pulse rotates the stored longitudinal magnetization back into the transverse plane. A stimulated echo 52 forms with its maximum at a time $t_1$ after the third RF pulse. The amplitude of the stimulated echo $M_{ste}$ is:

$$M_{ste} = (\tfrac{1}{2}) M_o \sin\alpha \sin\beta_1 \sin\beta_2 e^{-2t1/T2} e^{-(t2/T1)} SAT \qquad (3),$$

where $\beta_2$ is the angle of the third RF pulse 44.

It will be noted that Equations (1) and (3) have T2 weighting of the same form and the same saturation signal intensity loss factor. In order to avoid errors associated with the saturation signal reduction term, some of the prior art techniques as described in the Background of the Invention utilized a long sequence repeat time TR which increased the acquisition time and reduced accuracy and precision due to patient motion. The ratio of the magnitudes of the stimulated and primary echoes is independent of the saturation signal intensity reduction and the T2 weighting factor, i.e.

$$M_{STE}/M_{pe} = (1/2) \frac{\sin\beta_1 \sin\beta_2}{\sin^2(\beta_1/2)} e^{-t2/T1} . \qquad (4)$$

It will also be noted that the ratio is independent of the first tip angle $\alpha$.

The sequence is selected such that $t_2$ is much less than T1. This permits the $e^{-t2/T1}$ to be approximated as one. Further, if the second and third RF pulses have the same tip angle $\beta$, then Equation (4) reduces to:

$$M_{ste}/M_{pe} = (1/2) \frac{\sin^2\beta}{\sin^2(\beta/2)} = 2\cos^2(\beta/2). \qquad (5)$$

By measuring the ratio of the magnitudes of the primary and stimulated echoes, the actual tip angle produced by the second and third RF pulses can be accurately determined by simple trigonometry, i.e. Equation (5).

With reference again to FIG. 1, two passes or repetitions of the sequence described above are used to calibrate the 90° RF pulse. Because the goal is simply to determine a 90° pulse, the range over which the RF scale value is varied may be reduced. An incrementing step or means 60 increments the RF scale value from zero to a value (SAR permitting) that results in a calculated tip angle just greater than 120°. The RF scale value may be incremented in increments which are 1/10th of the maximum RF scale value, based upon SAR limits. A pulse sequence means 62 generates a pulse sequence as described in FIG. 2 with each pulse having the same angle $\alpha$.

At each increment of the RF scale value, an echo data monitoring or acquiring means 64 acquires the primary and stimulated echoes. The echo signals span the whole slice but fall off at the edges. To remove the edge effects, a one dimensional Fourier transform is performed to get a profile. An echo magnitude determining means 66 determines the amplitude of central, specifically zero frequency, terms of the one dimensional Fourier transformed primary and stimulated echoes. Data acquired during the zero RF scale value is used by a DC correction means 68 to produce a DC correction value. After the DC correction, the zero frequency term in a one dimensional Fourier transform is determined for each echo. A ratio means 70 determines the ratio of the magnitudes of the zero frequency terms of the primary and stimulated echoes. A tip angle calculating means 72 calculates a tip angle from the ratio in accordance with Equation (5). The calculated tip angle and the associated RF scale value form a data pair which is stored a memory means 74. This data pair provides a reference of the tip angle which each RF scale value produces.

In a second pass, the RF scale value is incremented from ⅜ths of the 120° tip angle RF scale value to the 120° tip angle RF scale value. The increment is 1/20th of the 120° tip RF scale value. After data pairs correlating each RF scale value with the tip angle have been calculated, a data analysis means 76 analyzes the stored data. In the preferred embodiment, a linear least-squares fit is made of the data pairs acquired during the second pass. A 90° tip angle RF scale value memory means 78 stores the RF scale value corresponding to 90°. In this manner, the RF scale value or energy required to produce a 90° tip angle is determined.

After determining the RF scale value which produces a 90° tip angle, the RF scale value which produces a 180° tip angle is determined. The pulse sequence generator 62 generates a pulse sequence in which the first RF pulse 40 is applied with the RF scale value that produces a maximum signal-to-noise ratio. The RF scale value in some embodiments may be the value that causes the Ernst angle, the 90° tip angle determined by the RF tip angle means 78, or the like. The second and third RF pulses 42, 44 have wave forms associated with a 180° RF pulse. The amplitude of the first RF pulse is held constant at the 90° tip angle RF scale value while the incrementing means 60 increments the second and third RF pulses amplitudes in subsequent repetitions.

Again, two passes are implemented to calibrate the 180° RF pulse in order to find the first maximum in the calculated tip angle vs. the RF scale value curve. In the first pass, the incrementing means 60 increments the RF scale value from zero to a value (SAR permitting) that results in a first maximum in the calculated tip angle vs. RF scale curve. The increments are preferably 1/10th of the maximum RF scale value based upon SAR limits. The echo data acquiring means 64 acquires primary and stimulated echo data. The magnitude determining means 66 determines the maximum magnitudes of each primary and stimulated echo pair. The tip angle calculating means 42 calculates the tip angle from Equation (5) and stores the RF scale value/tip angle pairs in the memory means 74. A non-linear fit is made by data analysis means 76 to determine the RF scale value associated with the maximum calculated tip angle. Again, because the tip angles $\beta$ are independent of the tip angle $\alpha$, any $\alpha$ may be used. However, maximizing the signal-to-noise ratio minimizes degradation during the analysis. Of course, the first pulse may also be selected to minimize other signal degrading factors as may be appropriate to the application.

In the second pass, the RF scale value for the second and third pulses is incremented from the maximum calculated tip angle less a half of the first pass increment to the maximum calculated tip angle plus a half of the first pass increment. Preferably, the second pass increment is 1/10th of the first pass increment such that the RF scale is incremented ten times in the second pass. The data analysis means 78 performs a non-linear fit on the RF scale value and tip angle pairs until the maximum calculated tip angle is determined. This RF scale value which corresponds to the 180° tip angle is stored in a 180° RF scale value memory means 80.

As described above, the primary and stimulated echoes are acquired and a DC correction made. The tip angle is calculated from the ratio of the magnitude of the primary and stimulated echoes in accordance with Equation (5) and associated tip angle and RF scale value pairs are stored. The least-squares fit or other data analysis on the second pass data determines the fitted line whose apex corresponds to a tip angle of 180°.

In this manner, RF scale values which produce 90° and 180° pulses are determined. A selected imaging protocol may be performed on the patient utilizing the RF scale values derived above for producing the 90° and 180° RF pulses. If the imaging protocol calls for RF pulses to cause other tip angles, analogous calibration procedures may be performed to derive the appropriate RF scale value for each such additional angle.

Although two passes are described in the preferred embodiment, a single pass may be utilized. The first pass merely focuses on an appropriate range for the second pass such that the second pass can be performed using small increments which are sure to span the 90° or 180° tip angle while not requiring excessive incremental steps to be taken. However, with appropriate range and increment values, a single pass could be utilized.

Figure 4:
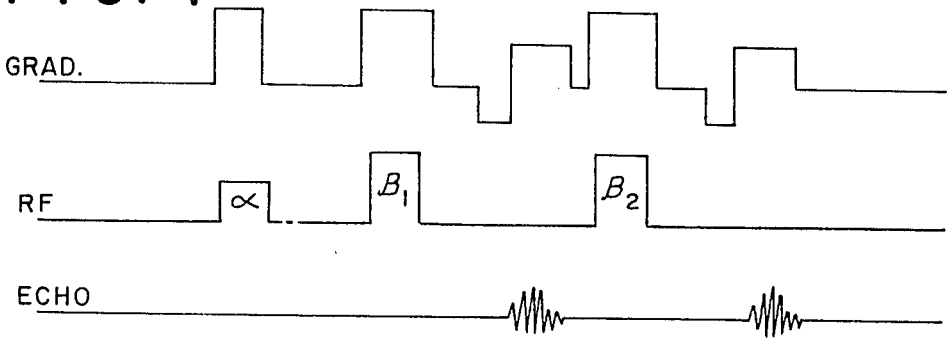

The form of slice select and read gradients are variable. The two gradients may be combined into a single constant gradient for this calibration procedure, as in FIG. 2, or may be kept separate such that the slice thickness and read out bandwidth are independently adjustable, as in FIG. 4. Additionally, the gradients may be applied in a fashion which reduces the effect of patient motion on the measurement by gradient moment nulling.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of calibrating radio frequency pulses comprising:
   applying a magnetic field gradient across an examination region;
   inducing a primary echo and a stimulated echo from a subject by applying first, second, and third RF pulses to the examination region, the first RF pulse being different from the second and third RF pulses, the second and third RF pulses being substantially the same;
   monitoring the stimulated and primary echoes;
   determining a tip angle from the monitored primary and stimulated echoes; and,
   storing a correlation between the determined tip angle and the magnitude of the second and third RF pulses.

2. The method as set forth in claim 1 wherein the first RF pulse causes a tip angle which optimizes a signal-to-noise ratio of the monitored echoes.

3. The method as set forth in claim 1 further including repeating the pulse train generating step a plurality of times with the second and third RF pulses selected to cause varying tip angles of about 180°;

monitoring the stimulated the stimulated and primary echoes from each pulse train and determining a correspondence between the second and third RF pulses and the determined tip angle;

storing the correspondence between the second and third RF pulse magnitude and the determined tip angle.

4. The method as set forth in claim 3 further including fitting a continuous curve to the stored RF pulse magnitude and determined tip angle and determining from the curve and RF pulse magnitude which produces a 180° tip angle.

5. The method as set forth in claim 1 wherein the step of monitoring the stimulated and primary echoes includes performing a Fourier transform on the monitored stimulated and primary echoes and determining corresponding central data values.

6. The method as set forth in claim 5 wherein the tip angle determining step includes determining a ratio of the corresponding central data values of the primary and stimulated echoes and calculating a tip angle $\beta$ from the ratio in accordance with:

peak magnitude ratio = $2\cos^2(\beta/2)$.

7. An apparatus for calibrating radio frequency pulses, the apparatus comprising:
means for applying a magnetic field gradient across a subject;
means for generating first, second, and third RF pulses to the subject to induce a primary echo and a stimulated echo from the subject, the first RF pulse being different from the second and third RF pulses, the second and third RF pulses being substantially the same;
means for monitoring the stimulated and primary echoes;
means for determining a tip angle from the monitored primary and stimulated echoes; and,
means for storing a correlation between the determined tip angle and the magnitude of the second and third RF pulses.

8. The apparatus as set forth in claim 7 wherein the first RF pulse causes a tip angle of which maximizes a signal-to-noise ratio of the primary and stimulated echoes.

9. The apparatus as set forth in claim 7 wherein the monitoring means monitors the stimulated and primary echoes from each of a plurality of pulse trains and the tip angle determining means determining a correspondence between the second and third RF pulses and the determined tip angle for each pulse train, such that the storing means stores the correspondences between the second and third RF pulse magnitudes and the determined tip angle of each pulse train.

10. The apparatus as set forth in claim 9 further including an analysis means for fitting a continuous curve to the stored RF pulse magnitudes and determined tip angles and determining from the curve an RF pulse magnitude which produces a 180° tip angle.

11. The apparatus as set forth in claim 7 wherein the monitoring means includes means for measuring a zero frequency term of Fourier transforms of the stimulated echo and the primary echo.

12. The apparatus as set forth in claim 8 wherein the tip angle determining means includes means for determining a ratio of the zero frequency terms and means for calculating a tip angle $\beta$ from the ratio in accordance with:

ratio = $2\cos^2(\beta/2)$.

13. A method of calibrating radio frequency pulses, the method comprising:
applying a magnetic field gradient across a subject;
applying a first RF pulse to the subject to create transverse magnetization in a rotating frame;
applying a second RF pulse to the subject which refocuses a portion of the transverse magnetization to generate a primary echo and to produce a net longitudinal magnetization;
applying a third RF pulse which rotates the longitudinal magnetization back into the transverse plane and generates a stimulated echo;
the first RF pulse being different from the second and third pulses and the second and third RF pulses being substantially the same;
monitoring the stimulated and primary echoes;
determining a tip angle from the monitored, primary and stimulated echoes; and,
storing a correlation between the determined tip angle and a magnitude of the second and third RF pulses.

* * * * *